United States Patent [19]

Hori

[11] Patent Number: 5,352,909

[45] Date of Patent: Oct. 4, 1994

[54] FIELD EFFECT TRANSISTOR AND METHOD FOR MANUFACTURING THE SAME

[75] Inventor: Yasuko Hori, Tokyo, Japan

[73] Assignee: NEC Corporation, Japan

[21] Appl. No.: 990,343

[22] Filed: Dec. 14, 1992

[30] Foreign Application Priority Data

Dec. 19, 1991 [JP] Japan .................................. 3-335393
Jan. 31, 1992 [JP] Japan .................................. 4-16060

[51] Int. Cl.⁵ .................. H01L 29/161; H01L 21/265
[52] U.S. Cl. .................................. 257/76; 257/192; 257/194; 257/200; 257/201; 257/283; 257/284; 257/621; 437/40; 437/104; 437/203; 437/228; 437/912
[58] Field of Search ............ 257/194, 192, 283, 284, 257/76, 200, 201, 621; 437/40, 104, 203, 228, 912

[56] References Cited

U.S. PATENT DOCUMENTS 5,021,857 6/1991 Suehiro .............................. 257/194
5,023,675 6/1991 Ishikawa ............................ 257/194

OTHER PUBLICATIONS

"Defects in Epitaxial Multilayers" by J. W. Matthews and A. E. Blakeslee, *Journal of Crystal Growth* 27 (1974), pp. 118–125, Dec. 1974.

*Primary Examiner*—Edward Wojciechowicz
*Attorney, Agent, or Firm*—Laff, Whitesel, Conte & Saret

[57] ABSTRACT

A field-effect transistor of a recessed structure having an etch stopper layer is disclosed. The etch stopper layer is composed of gallium phosphide or aluminium arsenide. The etch stopper layer protects an underlying semiconductor active layer of a metal-semiconductor field-effect transistor or an underlying donor layer of a two-dimensional electron gas field-effect transistor during etching the cap layer for forming a recess receiving a gate electrode. In case of etch stopper layer of aluminium arsenide, the etch stopper layer can be etched by ultrapure water.

18 Claims, 6 Drawing Sheets

FIELD EFFECT TRANSISTOR AND METHOD FOR MANUFACTURING THE SAME

FIELD OF THE INVENTION

The present invention relates to a field effect transistor (referred to as an FET hereinafter), and more particularly to an FET of a recessed structure.

BACKGROUND OF THE INVENTION

Such a recessed structure is known which is employed in a two-dimensional electron gas field effect transistor (referred to as a 2DEGFET hereinafter) or a metal-semiconductor transistor (referred to as a MESFET hereinafter) having a cap layer or a contact-resistance reduction layer.

A 2DEGFET utilizes two-dimensional electron gas accumulated at the interface of a heterojunction and has a high-speed and a low noise characteristics. Hence the 2DEGFET is recently put in practice for an element of an ultra low noise high frequency amplifier. Researches for large-scale-integrated circuit comprising 2DEGFETs are widely carried out in these day.

FIG. 1 shows a schematic structure of a conventional aluminium gallium-arsenide/gallium arsenide 2DEGFET as a typical example of a 2DEGFET of a recessed structure, in which an undoped gallium arsenide buffer layer 12, an undoped gallium arsenide channel layer 13, an aluminium gallium-arsenide donor layer 14 doped with impurities, such as Si, Se and Te, and a gallium arsenide cap layer 15 doped with impurities, such as Si, Se and Te, are consecutively grown on a semi-insulating arsenide substrate 11 by epitaxial processes. The cap layer 15 functions as a cap layer.

The combination of the donor layer 14 and the channel layer 13 constitutes a semiconductor active layer in which two-dimensional electron gas are generated. A gate electrode 16 for controlling the electron gas is formed on the donor layer 14 at the recess where the cap layer 15 is selectively etched. A source and a drain electrodes 17 and 18 are formed on the cap layer 15 adjacent to the gate electrode 16. Each of the source and drain electrodes forms an ohmic contact between the source or drain electrode and the active layer, the ohmic contact being improved by the cap layer.

FIG. 2 shows a schematic structure of a conventional gallium arsenide MESFET as a typical example of a MESFET of a recessed structure. MESFET is well known as a high frequency and high-speed element which is developed recently and now to be put in practice among other FETs. MESFET has an undoped gallium arsenide buffer layer 22, a gallium arsenide active layer 23 doped with impurities, such as Si, Se and Te, and a cap layer 24 doped with impurities, such as Si, Se and Te, consecutively grown on a semi-insulating gallium arsenide substrate 21 by epitaxial processes. A metal gate electrode 25 is formed on the active layer 23 at the recess where the cap layer 24 is selectively etched. A source and a drain electrodes 26 and 27 composed of a metal are formed on the cap layer adjacent to the gate electrode 25.

The recessed structure of the 2DEGFET and the MESFET as shown in FIGS. 1 and 2 is employed for controlling the threshold voltage thereof by adjusting the thickness of the donor layer of the 2DEGFET or the active layer of the MESFET. The recessed structure of the FETs is formed by selectively etching the cap layer using a photoresist pattern as a mask for receiving the gate electrode within the resultant recess.

order to form the recessed structure in the FETs as shown in FIGS. 1 and 2, wet etching is carried out for a controlled time interval by using, for example, $H_2SO_4$-$H_2O_2$ solution as an etchant. The etch rate of the cap layer depends on the concentration, temperature and the stirring rate of the etchant. It is difficult to adjust the conditions of the etchant precisely, so that the selective etching is not controlled accurately.

In case of 2DEGFET, since the selectivity of the etching is not enough between gallium arsenide and aluminium gallium-arsenide, unwanted etching of the aluminium gallium-arsenide forming the donor layer may arise. In case of MESFET, since the selectivity of the etching between the cap layer and the active layer is scarcely possible, again unwanted etching of the active layer may arise.

In both cases as described above, unwanted etching of the semiconductor active layer may arise or a desired etching may not be attained, so that the thickness of the donor layer or the active layer can not be adjusted precisely. It is, therefore, difficult to control the threshold voltage of FETs of a recessed structure precisely, resulting in up to a 8% fluctuation of the threshold voltage.

SUMMARY OF THE INVENTION

An object of the present invention is to eliminate the drawback described above and to provide an FET of a recessed structure having a correctly controlled threshold voltage.

Another object of the present invention is to provide a method for forming an FET of a recessed structure having a correctly controlled threshold voltage.

According to a first aspect of the present invention, there is provided an FET of a recessed structure comprising: a substrate; a semiconductor active layer carried by the substrate; an etch stopper layer composed of gallium phosphide or aluminium arsenide and a cap layer consecutively formed on the active layer, the cap layer having a recess formed by etching for exposing a portion of the etch stopper layer; a gate electrode formed on the bottom of the recess; and a source and a drain electrodes disposed on the cap layer and adjacent to the gate electrode.

According to a second aspect of the present invention, there is provided a method for forming an FET of a recessed structure including steps of: forming a semiconductor active layer carried by a substrate; forming an etch stopper layer composed of gallium phosphide or aluminium arsenide on the active layer; forming a cap layer on the etch stopper layer; forming source and drain electrodes on the cap layer; selectively etching the cap layer for forming a recess exposing the etch stopper layer from the bottom of the recess; and forming a gate electrode on the bottom of the recess.

With the first and second aspect of the present invention, when the etch stopper layer is composed of gallium phosphide, which is little etched by almost every etchant except aqua regia, hot phosphoric acid and bromomethanol, the gate electrode is formed on the etch stopper layer. In this case, the etch stopper layer is preferably composed of undoped gallium phosphide.

When the etch stopper layer is composed of undoped aluminium arsenide, which is deliquescent and hence may be etched by ultrapure water selectively from the channel layer, the etch stopper layer may be preferably etched before the gate electrode is formed.

Forming a gallium phosphide or aluminium arsenide layer as an etch stopper layer can provide an accurate control of the threshold voltage.

Although gallium phosphide has a lattice constant different from that of gallium arsenide or aluminium gallium-arsenide by almost 4%, misfit dislocation will not arise at the interface between the etch stopper layer and the adjacent layers formed of gallium arsenide or aluminium gallium-arsenide layer, when the thickness of the gallium phosphide etch stopper layer is less than a certain critical thickness. The critical thickness of the gallium phosphide layer formed adjacent to a gallium arsenide layer or a aluminium gallium-arsenide layer is determined from the strain of the interface, as described by J. W. Matthews and A. E. Blakeslee, in *Journal of Crystal Growth*, vol. 27, 1974, 118.

In case of etch stopper layer of aluminium arsenide, aluminium arsenide has a lattice constant approximately equal to that of gallium arsenide or aluminium gallium-arsenide, there is few problems during crystal growth in which misfit dislocation may arise.

BRIEF DESCRIPTION OF THE DRAWINGS

Other and further objects, features and advantages of the present invention will, be more apparent from the following description, referring to the accompanying drawings in which.

DESCRIPTION OF THE PREFERRED EMBODIMENTS

In this description, each of the structure of FETs is mainly presented by its fabrication steps according to embodiments of the present invention for the sake of simplification.

Figure 1:
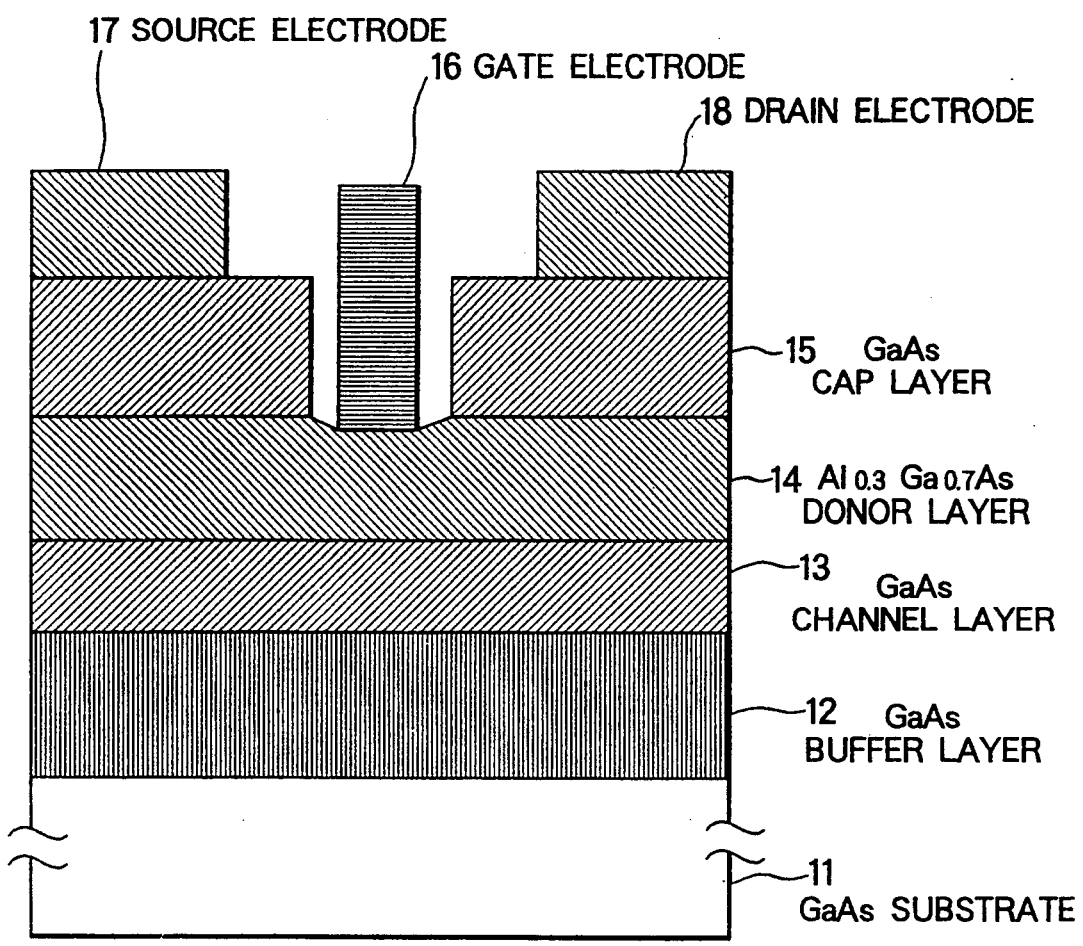
FIG. 1 is a cross-sectional view showing a schematic construction of a conventional 2DEGFET.
Figure 2:
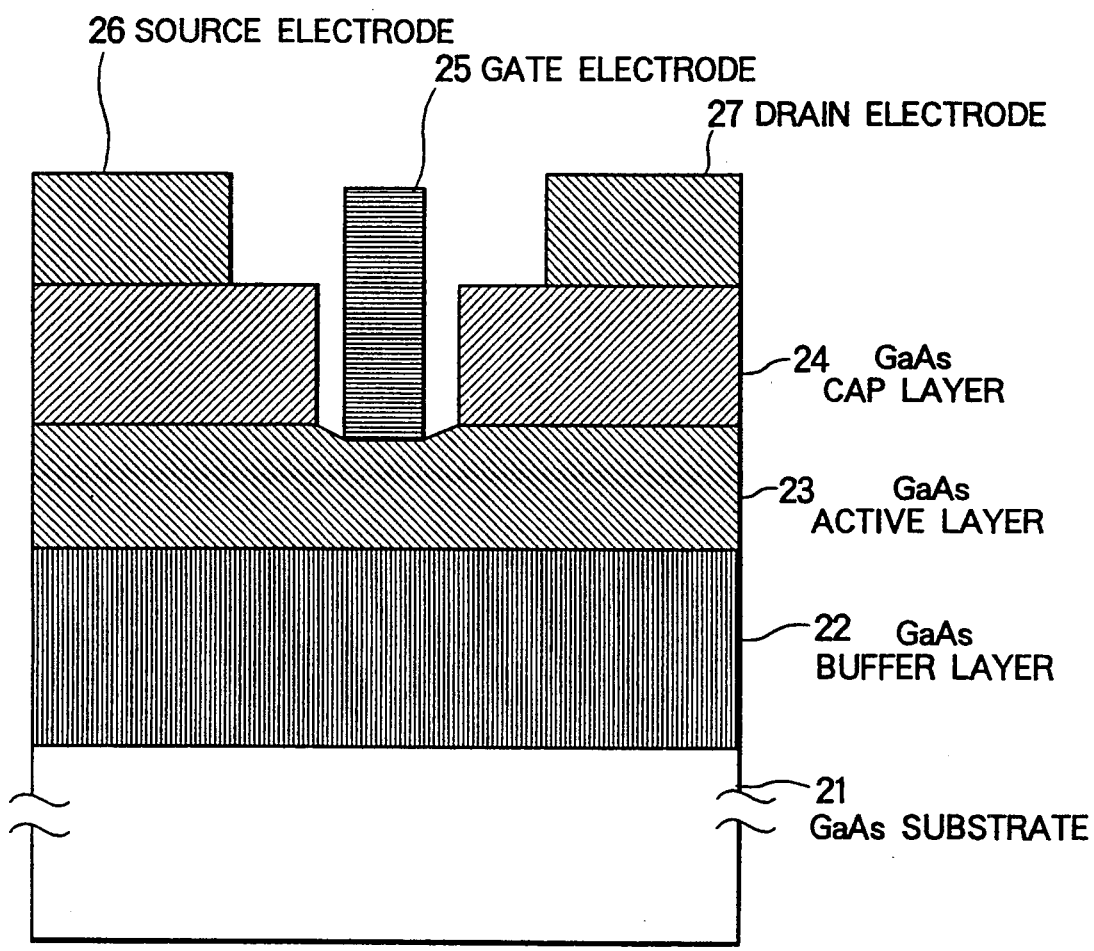
FIG. 2 is a cross-sectional view showing a schematic construction of a conventional MESFET.
Figure 3:
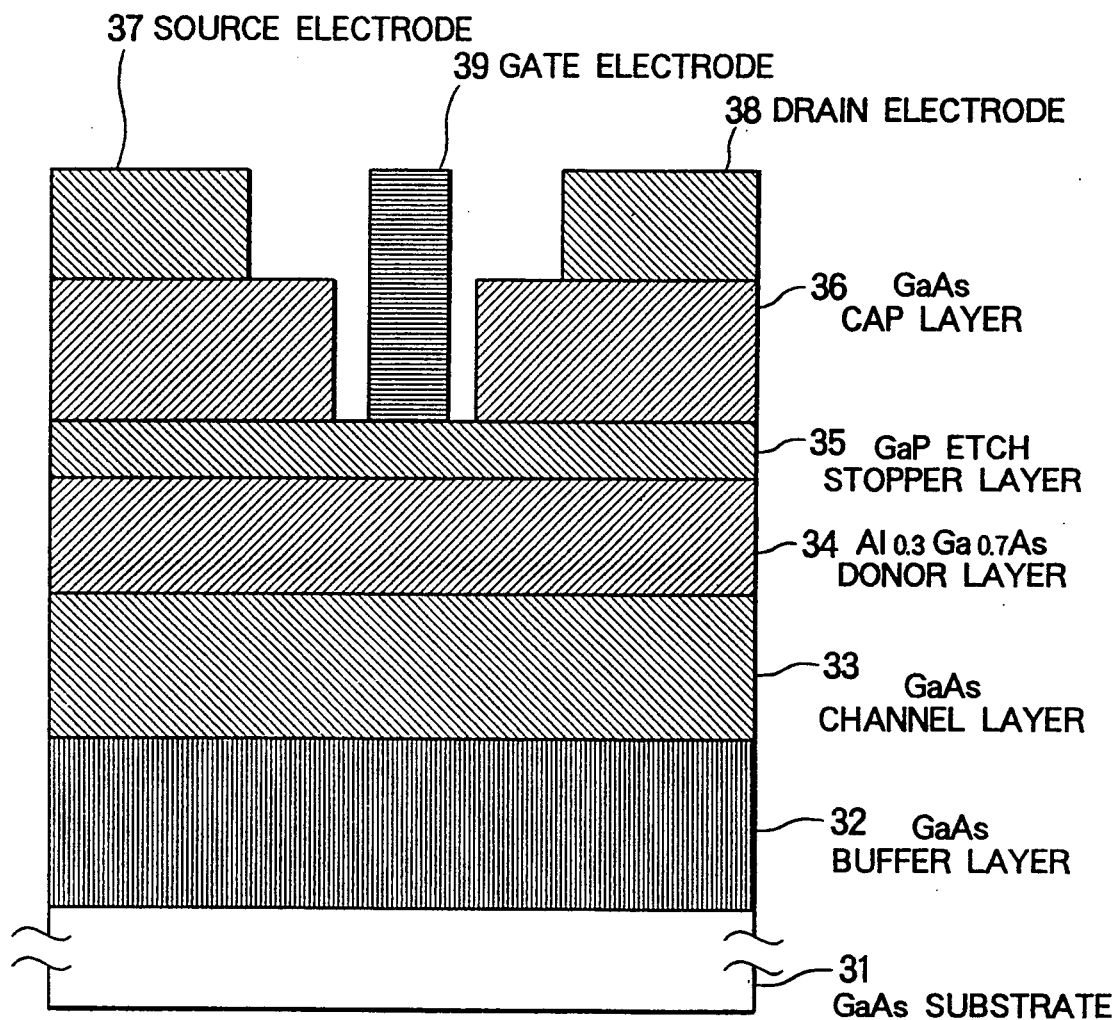
FIG. 3 is a cross-sectional view showing a schematic construction of a 2DEGFET according to an embodiment of the present invention.

FIG. 3 shows a schematic cross-section of a 2DEG-FET according to an embodiment of the present invention, in which an undoped gallium arsenide buffer layer 32 in a thickness of about 1 $\mu$m, an undoped gallium arsenide channel layer 33 in a thickness of about 500 angstrom, aluminium gallium-arsenide ($Al_{0.3}Ga_{0.7}As$) layer 34 in a thickness of about 400 angstrom doped with impurities, an undoped gallium phosphide etch stopper layer 35 in a thickness of about 20 angstrom, and a gallium arsenide cap layer 36 in a thickness of about 500 angstrom are consecutively grown on a semi-insulating gallium arsenide substrate 31 by epitaxial processes. The buffer layer 32 serves for the ease of an epitaxial process.

The gallium arsenide cap layer 36 doped with impurities functions as a contact-resistance reduction layer for improving the ohmic contact of the interface between a source and a drain electrodes 37 and 38 and the active layer, the active layer being constituted by a combination of the donor layer 34 and the channel layer 33. Doping of the layers with impurities as described above is carried out during the crystal growth processes. Such impurities are selected from the group of Si, Se, Te etc.

The source and the drain electrodes 37 and 38 are formed of, for example, aluminium for ohmic contact. During the fabrication steps, the source and the drain electrodes are formed on the cap layer 36 by, for example, lift-off method followed by an alloy diffusion process with heating. Hence, the source and the drain electrodes 37 and 38 are coupled with the channel layer 33 in which two-dimensional electron gas is generated.

Following the alloy diffusion step, the cap layer 36 is selectively etched for forming a recess at a room temperature. The gate electrode 39 composed of a metal such as aluminium is formed on the undoped etch stopper layer 35 for heterojunction or Schottky junction at the recess where the contact-resistance reduction layer 36 is selectively etched.

With the embodiment of FIG. 3, the donor layer 34 is composed of a semiconductor doped with impurities and has an electron affinity less than that of the channel layer 33 composed of an intrinsic semiconductor. Hence, the donor layer 34 functions generating two-dimensional electron gas within the channel layer 33 in which electron has a high mobility for a high-speed operation of the FET.

The donor layer 34 is composed of aluminium gallium-arsenide ($Al_{0.3}Ga_{0.7}As$) as shown in FIG. 3, so that the etch stopper layer 35 of gallium phosphide is formed in thickness of about 20 angstrom which is less than the critical thickness, i.e. about 56 angstrom. A 20 angstrom thickness of a gallium phosphide layer 35 is enough for stopping the liquid etchant during etching the cap layer 36 and yet causing almost no defect in the FET, since it is thin enough for assuring the function of the FET.

With the embodiment described above, although the ratio of aluminium to gallium in the donor layer of aluminium gallium-arsenide is exemplified as 0.3/0.7, it is only an example and not limited to such a ratio.

Figure 4:
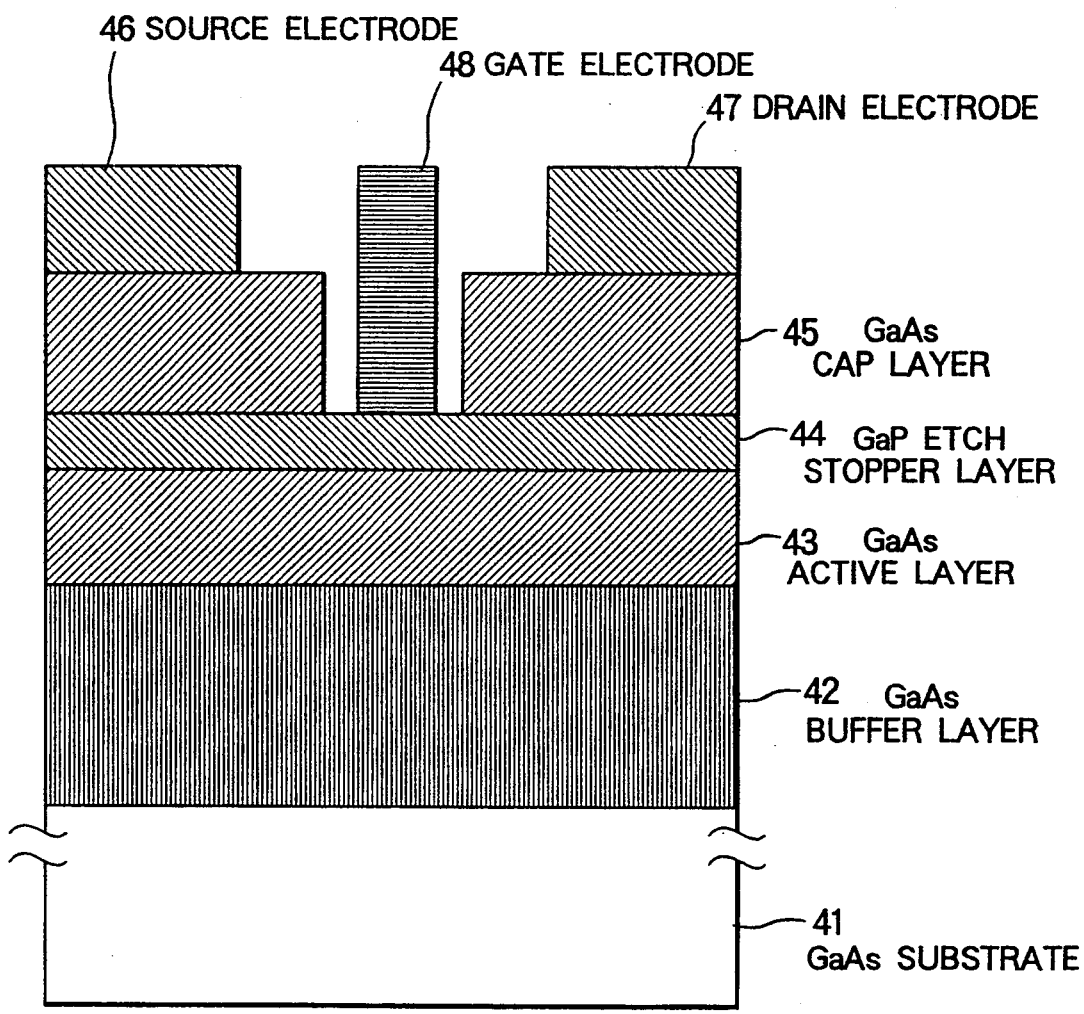
FIG. 4 is a cross-sectional view showing a schematic construction of a MESFET according to another embodiment of the present invention.

FIG. 4 shows a cross-section of a MESFET according to another embodiment of the present invention. An undoped gallium arsenide buffer layer 42 in a thickness of about 5000 angstrom, gallium arsenide active layer 43 in a thickness of about 3000 angstrom doped with impurities such as Si, Se and Te, an undoped gallium phosphide etch stopper layer 44 in a thickness of about 20 angstrom, and a gallium arsenide cap layer 45 in a thickness of about 1000 angstrom are consecutively grown by epitaxial processes on a semi-insulating gallium arsenide semiconductor substrate 41.

The source and drain electrodes 46 and 47 are composed of a metal such as aluminium alloy for ohmic contact. These electrodes are formed on the cap layer 45 by, for example, lift-off method followed by an alloy diffusion process with heating, so that these electrodes are coupled with the active layer 43. The gate electrode 48 is composed of a metal such as aluminium for a heterojunction or Schottky junction and disposed on the undoped etch stopper layer 44 at the recess where the cap layer 45 is selectively etched.

Since the underlying active layer 43 is composed of gallium arsenide doped with impurities, gallium phosphide etch stopper layer 44 is formed in a thickness of 20 angstrom. A 20 angstrom thickness of a gallium phosphide layer is enough for stopping the liquid etchant during etching the cap layer 45 with the etchant and yet causing almost no defect in the FET.

According to the embodiments described above, the threshold voltage of each of the FETs can be precisely controlled, even within a 3% fluctuation among the FETs in a single wafer.

The thickness of the gallium phosphide etch stopper layer as described above is only an example and thus not limited to 20 angstrom. It is possible to employ a thickness of equal to or less than about 56 angstrom for the etch stopper layer. Thickness more than about 56 angstrom may lead to misfit dislocation in a interface between the gallium phosphide and gallium arsenide or aluminium gallium-arsenide during crystal growth processes.

Figure 5:
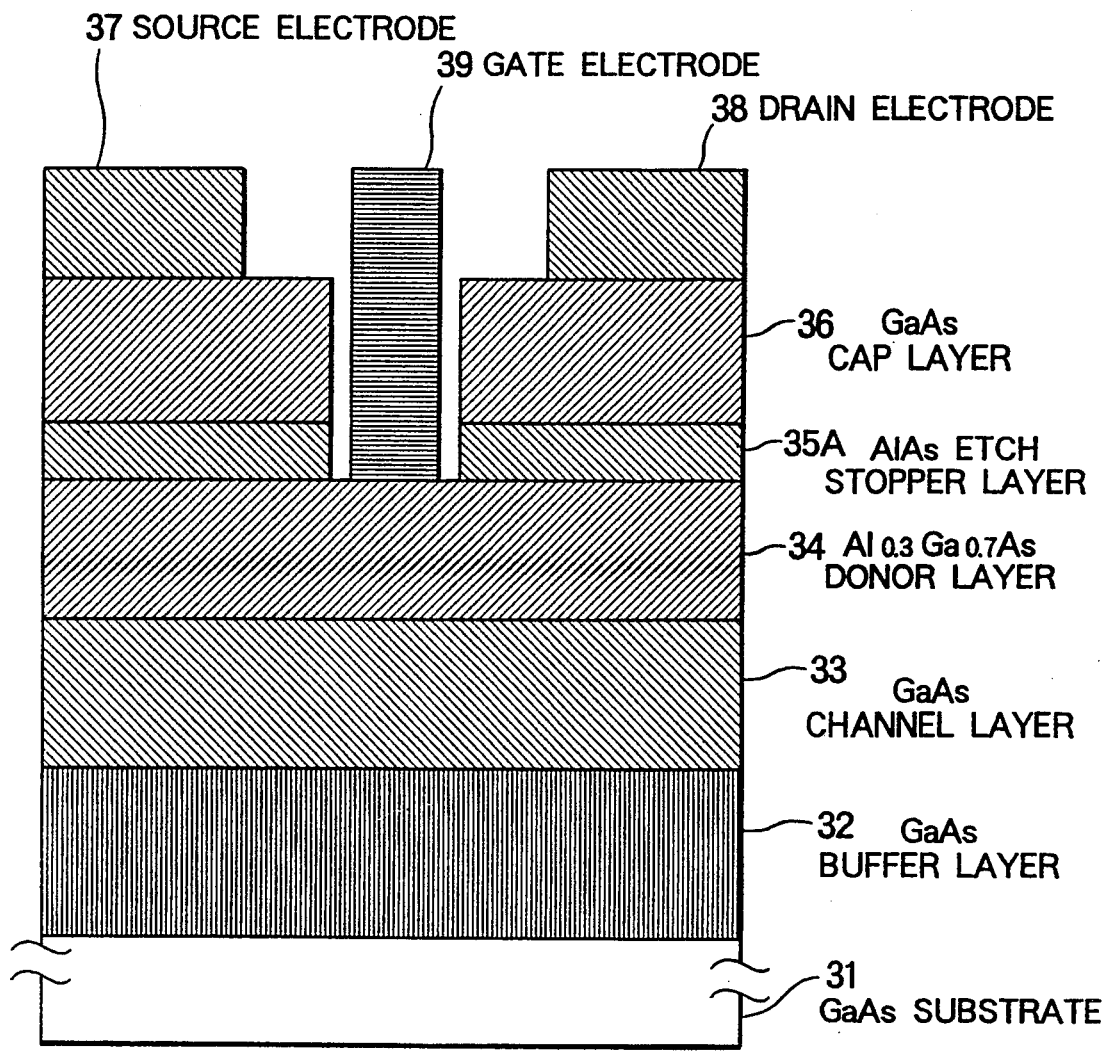
FIG. 5 is a cross-sectional view showing a schematic construction of a 2DEGFET according to still another embodiment of the present invention.

FIG. 5 shows a cross-section of a 2DEGFET according to still another embodiment of the present invention. This embodiment is different from the embodiment of FIG. 3 in that the etch stopper layer 35A in FIG. 5 is formed of an undoped aluminium arsenide layer of, for example, a 100 angstrom thickness, which is less than the critical thickness for avoiding misfit dislocation, and that it is etched at the bottom of the recess as shown in FIG. 5. The remaining construction of this embodiment is similar to that of FIG. 3. Reference numerals in FIG. 5 are similar to those in FIG. 3 for the sake of understanding.

The etch stopper layer 35A is selectively etched by washing the substrate as a whole with ultrapure water between the step of selectively etching the cap layer 36 and the step of forming the gate electrode 39. Washing with ultrapure water enables the undoped aluminium arsenide layer 35 to be selectively etched. Hence, the gate electrode 39 can be formed directly on the donor layer 34, so that the electron mobility from the gate electrode 39 to the electron supply layer 34 is not affected.

Figure 6:
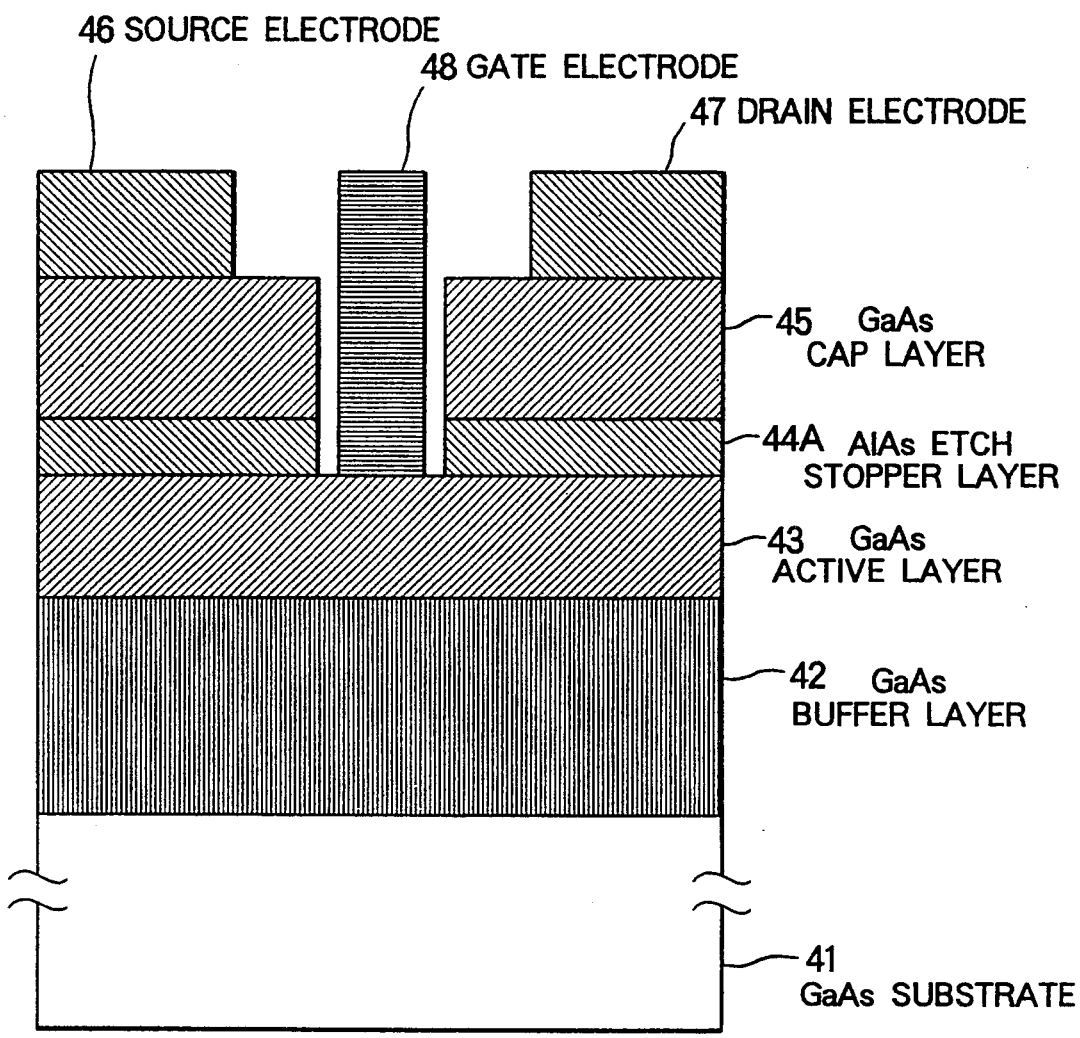
FIG. 6 is a cross-sectional view showing a schematic construction of a MESFET according to still another embodiment of the present invention.

FIG. 6 shows a cross-section of a MESFET of still another embodiment according to the present invention. This embodiment is different from the embodiment of FIG. 4 in that the etch stopper layer 44A is formed of an undoped aluminium arsenide layer of, for example, a 100 angstrom thickness and that it is etched at the bottom of the recess as shown in FIG. 6. The remaining construction in FIG. 6 is similar to that of FIG. 4. The etch stopper layer 44A is selectively etched by washing with ultrapure water as described in connection with the embodiment of FIG. 5. The reference numerals in FIG. 6 are similar to those in FIG. 4.

The FETs according to the embodiments are described as having layers each of a particular material and a particular thickness. However, various modification is possible from the embodiments. For example, the 2DEGFET may be a pseudomorphic 2DEGFET having an active layer formed of aluminium gallium-arsenide/indium gallium-arsenide. Besides, a buffer layer is not necessarily provided on the substrate.

Since above embodiments are described only for examples, the present invention is not limited to such embodiments and it will be obvious for those skilled in the art that various modifications or alterations can be easily made based on the above embodiments under the scope of the present invention.

What is claimed is:

1. A field-effect transistor comprising: a substrate; a semiconductor active layer carried by said substrate; an etch stopper layer composed of gallium phosphide and a cap layer consecutively formed on said active layer, said cap layer having a recess formed by etching for exposing a portion of said etch stopper layer; a gate electrode formed on the bottom of the recess; and a source and a drain electrodes disposed on said cap layer and adjacent to the gate electrode.

2. A field-effect transistor as defined in claim 1 wherein said cap layer is composed of gallium arsenide.

3. A field-effect transistor as defined in claim 1 further comprising a buffer layer formed on said substrate, said active layer being formed on said buffer layer.

4. A field-effect transistor as defined in claim 1 wherein said active layer is constituted by an undoped channel layer and a donor layer doped with impurities.

5. A field-effect transistor as defined in claim 4 wherein said donor layer and channel layer are composed of aluminium gallium-arsenide and undoped gallium arsenide, respectively.

6. A field-effect transistor as defined in claim 4 wherein said channel layer and donor layer are composed of aluminium gallium-arsenide and indium gallium-arsenide, respectively.

7. A field-effect transistor as defined in claim 1 wherein said active layer is composed of a gallium arsenide layer.

8. A field-effect transistor comprising: a substrate; a semiconductor active layer carried by said substrate; etch stopper layer composed of aluminium arsenide and a cap layer consecutively formed on said substrate, said cap layer having a recess formed by etching; a metal gate electrode formed on the bottom of the recess; and a source and a drain electrodes disposed on said cap layer and adjacent to the gate electrode.

9. A field-effect transistor as defined in claim 8 wherein said gate electrode is formed on said active layer at a portion where the etch stopper layer is selectively etched.

10. A field-effect transistor as defined in claim 8 further comprising a buffer layer formed on said substrate, said active layer being formed on said buffer layer.

11. A field-effect transistor as defined in claim 8 wherein said cap layer is composed of gallium arsenide.

12. A field-effect transistor as defined in claim 8 wherein said active layer is constituted by an undoped channel layer and a donor layer doped with impurities.

13. A field-effect transistor as defined in claim 12 wherein said donor layer and channel layer are composed of aluminium gallium-arsenide and undoped gallium arsenide, respectively.

14. A field-effect transistor as defined in claim wherein said channel layer and donor layer are composed of aluminium gallium-arsenide and indium gallium-arsenide, respectively.

15. A field-effect transistor as defined in claim 8 wherein said active layer is composed of a gallium arsenide layer.

16. A method for manufacturing a field-effect transistor of a recessed structure including steps of: forming a semiconductor active layer carried by a substrate; forming an etch stopper layer composed of gallium phosphide on said active layer; forming a cap layer on said etch stopper layer; forming source and drain electrodes on said cap layer; selectively etching said cap layer for forming a recess exposing said etch stopper layer; and forming a gate electrode on said etch stopper layer at the recess.

17. A method for manufacturing a field-effect transistor of a recessed structure including steps of: forming a semiconductor active layer carried by a substrate; forming an etch stopper layer composed of aluminium arsenide on said active layer; forming a cap layer on said etch stopper layer; forming source and drain electrodes on said cap layer; selectively etching said cap layer for forming a recess exposing said etch stopper layer; and forming a gate electrode on the bottom of the recess.

18. A method for manufacturing a field-effect transistor of a recessed structure as defined in claim 17 further including a step of selectively etching said etch stopper layer between the step of selectively etching said cap layer and the step of forming a gate electrode.

* * * * *